Aug. 4, 1970 R. E. GAREIS 3,522,452

HYSTERETIC GATING CIRCUIT FOR SILICON CONTROLLED RECTIFIER

Filed May 20, 1968 2 Sheets-Sheet 1

INVENTOR.
RONALD E. GAREIS

BY Harold R. Woods

HIS ATTORNEY

Aug. 4, 1970 R. E. GAREIS 3,522,452

HYSTERETIC GATING CIRCUIT FOR SILICON CONTROLLED RECTIFIER

Filed May 20, 1968 2 Sheets-Sheet 2

INVENTOR.
RONALD E. GAREIS

BY [signature]

HIS ATTORNEY

United States Patent Office 3,522,452

Patented Aug. 4, 1970

3,522,452

HYSTERETIC GATING CIRCUIT FOR SILICON CONTROLLED RECTIFIER

Ronald E. Gareis, Roanoke, Va., assignor to General Electric Company, a corporation of New York Filed May 20, 1968, Ser. No. 730,304
Int. Cl. H03k 17/00
U.S. Cl. 307—252 3 Claims

ABSTRACT OF THE DISCLOSURE

A hysteretic gating circuit including a biasing circuit connected across an SCR and to the base of a transistor having its emitter connected to the SCR cathode. When the SCR begins to conduct, the decrease in anode-to-cathode voltage causes a change in the transistor base voltage. The resulting change in the transistor conduction level reduces the SCR cathode voltage, thereby increasing the gate-to-cathode voltage. The increased gate-to-cathode voltage establishes an increased gate current which initially drives the SCR towards conduction and thereafter provides a deadband to prevent SCR switching due to noise currents at the SCR gate.

BACKGROUND OF THE INVENTION

The present invention relates to conduction control circuits and more particularly to a hysteretic gating circuit for a silicon controlled rectifier.

A conventional silicon controlled rectifier or SCR is a three layer semiconductor device having an anode terminal, a cathode terminal, and a gate terminal. When a positive voltage of a certain magnitude is applied between its anode terminal and its cathode terminal, an SCR will be off or nonconducting if the current at the gate terminal has less than a known threshold value. With the same anode-to-cathode voltage, the SCR switches into an on or conducting condition when the gate current exceeds the threshold value. Circuit designs are usually based on the fact that an SCR switches to its conductive state whenever the value of the net gate current exceeds the threshold value. However, the inverse is not always true. Conditions may require that an SCR continue to conduct even though the component of the net gate current that is proportional to a condition being monitored temporarily drops below the threshold value. A negative noise current component can cause the net gate current to temporarily drop below the threshold level even though the component of the net gate current based on the condition being monitored remains above the threshold level. By creating a hysteretic switching action, the effects of negative noise current components at the gate terminal are minimized.

Silicon controlled rectifiers also find favor as on-off switches because they can become fully conductive in a matter of microseconds in response to a triggering signal. The switching speed may cause problems, however, where the SCR is used with an inductive load. An SCR can switch to and latch in its conductive state only if the net gate current remains above the threshold level long enough for the anode-to-cathode current through the SCR to build up to a conduction-sustaining or holding level. Normally the anode-to-cathode current increases rapidly. However, with an inductive load, the buildup of anode-to-cathode current is relatively slow. Because of this, an SCR with an inductive load may be driven back into its nonconductive state prematurely when the net gate current falls below the threshold level before the current through the SCR has built up to a holding level.

SUMMARY OF THE INVENTION

The present invention is a hysteretic circuit having a first means for producing a first voltage in response to a decrease in the anode-to-cathode voltage of a controlled rectifier accompanying the application of a conduction-initiating signal to the gate terminal of the controlled rectifier. A second means responds to the first voltage to increase the gate-to-cathode voltage of the controlled rectifier. The increased gate-to-cathode voltage establishes an increased gate current which drives the controlled rectifier towards a state of maximum conductivity and thereafter provides a signal deadband.

DESCRIPTION OF THE DRAWINGS

While the specification concludes with claims particularly pointing out and distinctly claiming that which is regarded as the present invention, the details of one embodiment of the invention along with its further objects and advantages may be more readily ascertained from the following detailed description when read in conjunction with the accompanying drawings in which:

DETAILED DESCRIPTION

Figure 1:
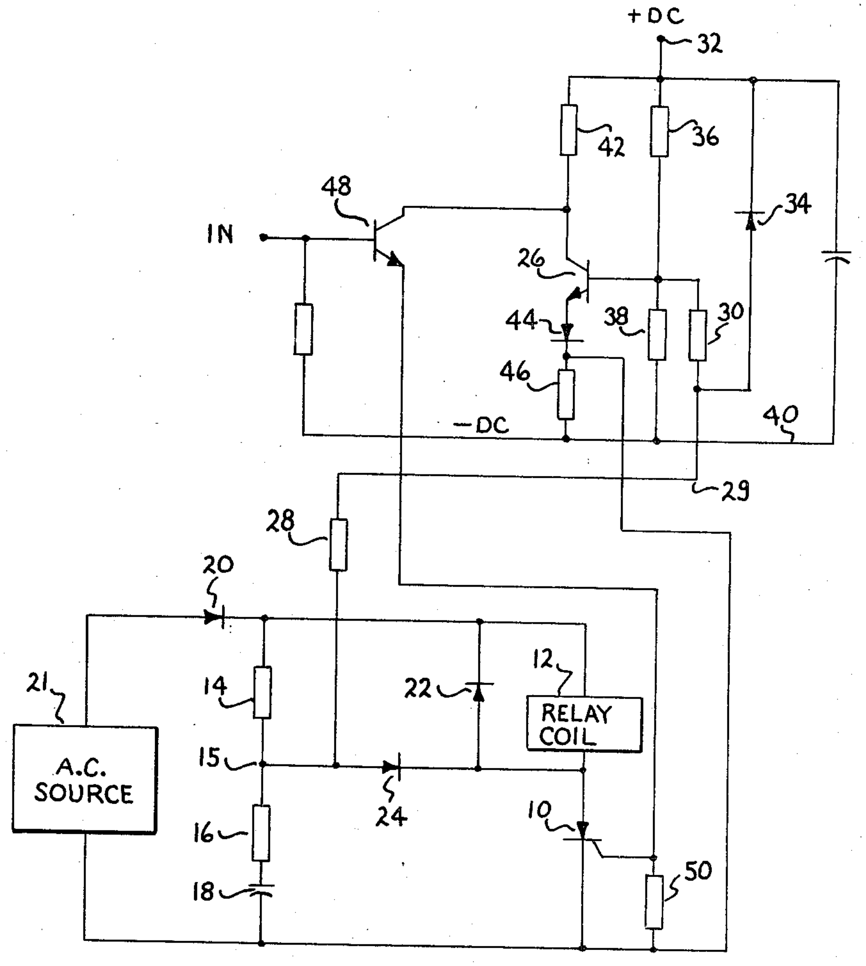
FIG. 1 is a schematic diagram of a hysteretic gating circuit incorporating the present invention.

Referring now to FIG. 1, a hysteretic gating circuit controls a silicon controlled rectifier or SCR 10 connected in series with an inductive load such as a relay coil 12 which, in a preferred embodiment, is in parallel with a free wheeling diode 22. When the SCR 10 is in its conductive state, the relay coil 12 is energized by half wave rectified voltage produced by a diode 20 in series with an AC voltage source 21. The SCR 10 and the relay coil 12 are connected in parallel with the series combination of a first resistor 14, a second resistor 16, and a charging capacitor 18. When the SCR 10 is in its nonconductive state, the capacitor 18 is charged by the voltage source 21 during positive half cycles to provide a positive anode-to-cathode voltage across the SCR 10. When the SCR 10 is driven to its conductive state, the capacitor 18 discharges through the resistor 16, a diode 24, and the SCR 10.

The junction 15 of the resistors 14 and 16 is connected to the base terminal of a controllable switching device or transistor 26 through a first voltage divider including resistors 28 and 30. The junction 29 of those resistors is connected to a direct current or DC source 32 through an inversely poled diode 34. The base voltage for the transistor 26 is normally established by means of a second voltage divider including resistors 36 and 38 which form a series path between the DC source 32 and a terminal 40 maintained at a suitable negative DC potential. The collector terminal of the transistor 26 is connected to the DC source 32 through a collector resistor 42. The emitter circuit of the transistor 26 includes a temperature compensating diode 44 in series with a resistor 46 connected to the terminal 40.

A second transistor 48 having its collector terminal connected to the collector terminal of the transistor 26 and its emitter terminal connected to the gate terminal for the SCR 10 provides amplification for an input signal representative of a condition being monitored. Positive voltage at the base terminal of the transistor 48 causes that transistor to conduct direct current from the source 32 to a biasing resistor 50 connected between the gate terminal and the cathode terminal of the SCR 10.

Briefly, the circuit described above operates in the following manner to establish a hysteretic switching action for the SCR 10. A positive input signal of sufficient strength at the base terminal of the transistor 48 permits the conduction of sufficient direct curent to the biasing resistor 50 to establish a trigegring or conduction-initiating signal at the gate terminal of SCR 10, assuming that the anode terminal of the SCR 10 is sufficiently positive with respect to the cathode terminal. An immediate decrease in the anode voltage is reflected through the voltage divider with resistors 28 and 30 to produce a first voltage at the base terminal of the transistor 26 to drive that transistor towards its nonconductive state. As the transistor 26 becomes less conductive, the voltage in its emitter circuit is reduced and, as a consequence, the voltage at the cathode terminal of the SCR 10 is also reduced. Since the voltage on the gate termnial of the SCR 10 is a function of the input signal to the base of the transistor 48 only, the reduction in the cathode voltage for the SCR 10 results in an increased gate-to-cathode voltage differential and an increased gate current.

Figures 2, 2A, 2B, 2C, 2D, 2E:
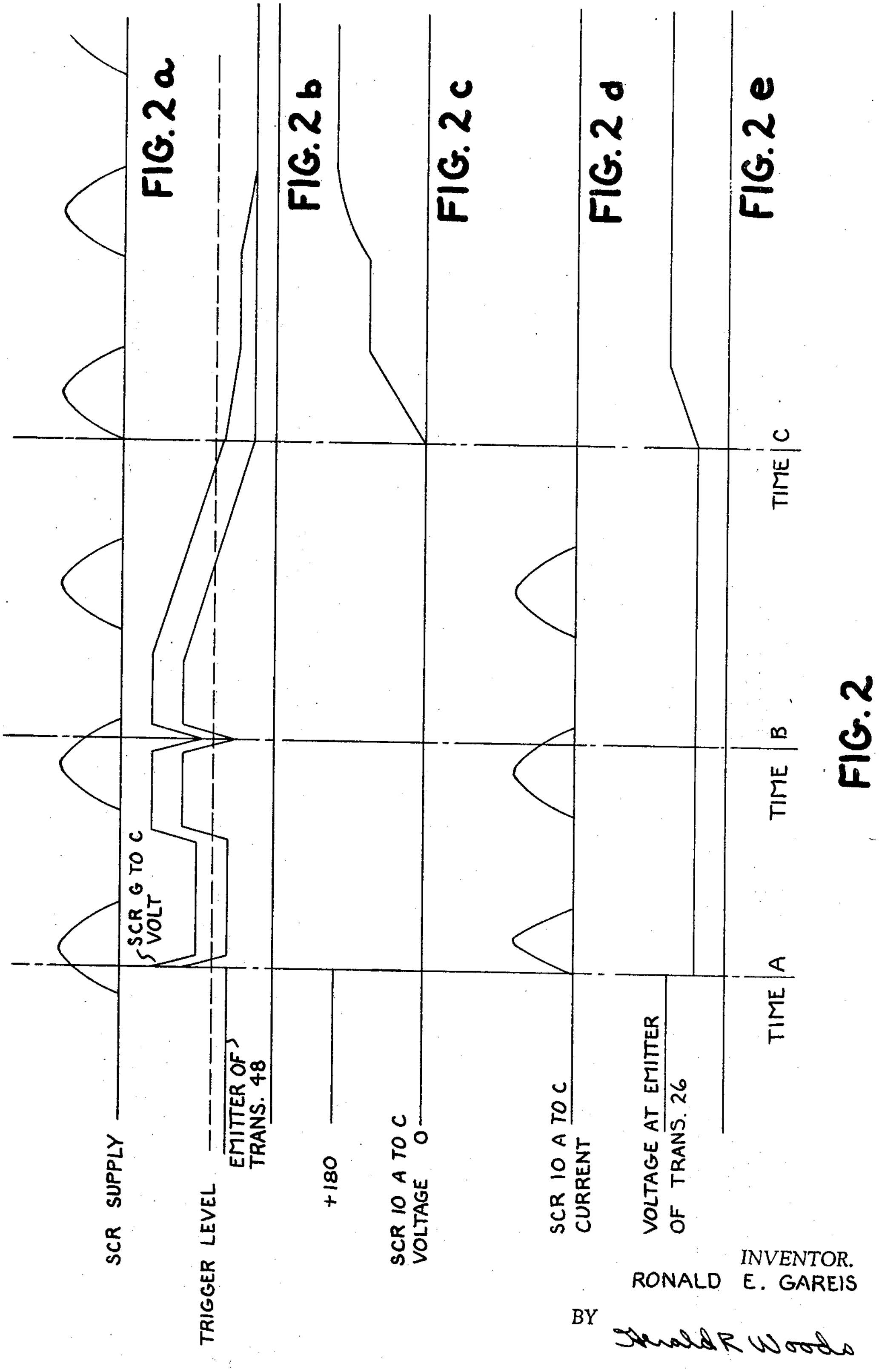
FIG. 2 is a compilation of waveforms generated within the circuit of FIG. 1 under various operating conditions.

The hystetic switching action is more readily understood from the waveforms of FIG. 2. FIG. 2*a* represents half wave voltage pulses applied across the relay coil 12 and the SCR 10. Referring to the waveforms at the left end of FIG. 2, if the SCR 10 has not been triggered for several cycles of the supply voltage by virtue of the fact that emitter voltage of transistor 48 (FIG. 2*b*) has remained below a conduction-initiating or triggering level, the SCR anode-to-cathode voltage (FIG. 2*c* is at a maximum, the SCR anode-to-cathode current (FIG. 2*d*) is insignificant, and the voltage in the emitter circuit of transistor 26 (FIG. 2*e*) is at a relatively high value.

The circuit conditions remain unchanged until a time A when a voltage spike at the base terminal of transistor 48 produces a triggering voltage at the gate terminal of the SCR 10. Although the current through the SCR 10 can not change instantaneously due to the inductive properties of the relay coil 12, the anode voltage of the SCR 10 is reduced instantaneously. The effect of capacitor 18 on the anode voltage as it discharges through SCR 10 is considered insignificant because the magnitude of resistor 16 and thus the time constant for the RC combination are quite high.

With the silicon controlled rectifier 10 being triggered into conduction, a discharge path for the DC source 32 is stablished through resistors 28 and 30 and diode 24, resulting in a reduced voltage at the base terminal of the transistor 26. The reduced base voltage changes the conduction level for transistor 26 and causes the emitter voltage to drop to a new relatively lower value. The decreased emitter voltage increases the gate-to-cathode voltage differential and consequently the net gate current for the SCR 10. While the SCR 10 is in its conductive state, the voltage at the junction 15 and at the base and the emitter of the transistor 26 remain at their lower levels. As a result, the voltage on the cathode of SCR 10 remains at a lower level. The gate-to-cathode voltage differential follows the voltage at the emitter terminal of the transistor 48 but remains at a relatively higher level due to the decreased cathode voltage.

Because the voltage at the gate terminals of SCR 10 from the transistor 48 must fall below the conduction-initiating level by an amount equal to the reduction in the cathode voltage before the gate-to-cathode voltage differential falls below the conduction-sustaining level, a hysteretic effect does exist. While the SCR 10 is in its conductive state, the voltage drop across it is quite small whereas the current through it follows the current supplied by source 21. The hysteretic effect of the gating circuit creates a deadband within which small negative noise currents do not affect the SCR 10. For example, although a negative noise current shown at time B causes the voltage on the emitter of the transistor 48 to drop below the trigger level for the SCR 10, the gate-to-cathode voltage differential and the gate current remains above the conduction-sustaining level. Under such conditions, the SCR 10 continues to conduct as if there were no noise currents in the circuit.

The SCR 10 ceases to conduct when its gate voltage falls to the point where the gate-to-cathode voltage differential or the gate current no longer exceeds the conduction-sustaining level. If the differential falls below the conduction-sustaining level during a positive half cycle, the SCR 10 continues to conduct only for the duration of that half cycle. If the differential falls below the conduction-sustaining level during a negative half cycle, the SCR 10 does not conduct during succeeding half cycles. To illustrate, at time C the emitter voltage for the transistor 48 has decreased to the point where even the increased gate-to-cathode voltage differential for the SCR 10 is no longer above the conduction-sustaining level.

The circuit does not immediately return to its preconduction state when SCR 10 ceases to conduct. The high time constant for the combination of resistor 16 and capacitor 18 prevents the capacitor 18 from charging to its maximum for several cycles. As the capacitor 18 begins to charge during the first positive half cycle of supply voltage following the cessation of conduction through SCR 10, the voltage at the base terminal of the transistor 26 rises towards its preconduction level. This rise in base voltage causes the voltage on the cathode of the SCR 10 to rise slightly and the gate-to-cathode voltage differential to decrease correspondingly. During the succeeding positive half cycles, the capacitor 18 continues to charge toward its maximum voltage while the gate-to-cathode voltage differential continues to diminish.

Approximately one AC cycle after the SCR 10 has stopped conducting the capacitor 18 has charged to a sufficiently high voltage that diode 34 becomes forward biased. This clamps the voltage at junction 29 at the level of the DC voltage source 32 and restores the voltages at the base and emitter terminals of transistor 26 to their preconduction state. The clamping diode 34 forces the trigger voltage to depend on only the DC voltage source 32 and resistors 30, 36, and 38, so that small variations in the AC source voltage 21 do not affect the trigger voltage.

To summarize the preceding description, the operation of transistor 26 provides a hysteretic effect for the gating of SCR 10 since the voltage required to halt conduction through the SCR 10 must be of a lower magnitude then the voltage required to initiate conduction. Negative noise currents at the gate terminal of SCR 10 do not effect the conductivity of the SCR so long as their negative magnitudes are less than the positive increase in gate current caused by the increased gate-to-cathode voltage differential. In addition to establishing a deadband, the hysteretic circuit serves another useful purpose. Where an SCR is used with an inductive load, the firing of the SCR results in an instantaneous change in the voltage across the SCR, but not in the current through the SCR. If the gating pulse is extremely short, the anode-to-cathode current that builds up before the end of the pulse may not be great enough to sustain conduction. Consequently, the SCR may prematurely turn off. The chances of this premature turn off are reduced when the present invention is used because the net gate current increases immediately following a drop in the anode-to-cathode voltage for the SCR.

While there has been described what is thought to be a preferred embodiment of the present invention, variations and modifications therein may occur to those skilled in the art. Therefore, it is intended that the appended claims shall be construed to include all such variations and modifications as fall within the true spirit and scope of the invention.

I claim:

1. For use with a load having inductive characteristics, a circuit including a power source, a controlled rectifier with anode, cathode, and gate terminals for selectively connecting said power source to the load in response to conduction-initiating signals at its gate terminal a hysteretic circuit responsive to a decrease in the anode-to-cathode voltage of said rectifier following the application of a conduction-initiating-signal thereto to increase the gate-to-cathode voltage of said rectifier, a controllable switching device having an output terminal connected to the cathode of said rectifier and an input terminal for controlling the conduction state of said controllable switching device, and a biasing circuit electrically connecting said rectifier to the input terminal of said controllable switching device to alter the conduction state of said device upon a decrease in voltage across said rectifier whereupon the output of said device increases the gate-to-cathode voltage of said rectifier.

2. For use with a load having inductive characteristics, a circuit including a power source, a controlled rectifier with anode, cathode, and gate terminals for selectively connecting said power source to the load in response to conduction-initiating signals at its gate terminal a hysteretic circuit responsive to a decrease in the anode-to-cathode voltage of said rectifier following the application of a conduction-initiating-signal thereto to increase the gate-to-cathode voltage of said rectifier, a current source, a transistor having a collector terminal connected to said current source, an emitter terminal connected to the cathode terminal of said rectifier, and a base terminal, and a biasing circuit connecting the base terminal of said transistor to said rectifier, said biasing circuit being responsive to a decrease in the anode-to-cathode voltage of said rectifier to alter the conductive state of said transistor following the application of a conduction-initiating signal to the gate terminal of said rectifier.

3. The invention set forth in claim 2 wherein the said biasing circuit includes a voltage divider connected between said current source and the anode terminal of said rectifier, said voltage divider being connected to the base terminal of said transistor, and a series combination of a resistor and a capacitor connected in parallel with said rectifier, said series combination being short-circuited upon initial conduction of said rectifier.

References Cited

UNITED STATES PATENTS

| | | | |
|---|---|---|---|
| 2,939,064 | 5/1960 | Momberg | 307—252 |
| 2,998,547 | 8/1961 | Berman | 307—252 |

JOHN S. HEYMAN, Primary Examiner

D. M. CARTER, Assistant Examiner

U.S. Cl. X.R.

307—305